United States Patent [19]
Robb et al.

[11] Patent Number: 5,589,408
[45] Date of Patent: Dec. 31, 1996

[54] METHOD OF FORMING AN ALLOYED DRAIN FIELD EFFECT TRANSISTOR AND DEVICE FORMED

[75] Inventors: Francine Y. Robb; Stephen P. Robb, both of Tempe; Paul J. Groenig, Chandler, all of Ariz.

[73] Assignee: Motorola, Inc., Schaumburg, Ill.

[21] Appl. No.: 498,158

[22] Filed: Jul. 5, 1995

[51] Int. Cl.$^6$ .................................. H01L 21/265
[52] U.S. Cl. .................. 437/29; 437/31; 437/39; 437/143; 437/188; 437/189; 437/197; 437/247
[58] Field of Search ................... 437/29, 31, 39, 437/143, 139, 177, 188, 189, 194, 197, 202, 247

[56] References Cited

U.S. PATENT DOCUMENTS

| | | | |
|---|---|---|---|
| 4,301,592 | 11/1981 | Lin | 437/188 |
| 4,525,221 | 6/1985 | Wu | 437/188 |
| 5,178,370 | 1/1993 | Clark et al. | 257/212 |
| 5,273,917 | 12/1993 | Sakurai | 437/974 |
| 5,397,716 | 3/1995 | Anderson | 437/31 |
| 5,451,544 | 9/1995 | Gould | 437/247 |

OTHER PUBLICATIONS

Sakurai et al., Power MOSFETs Having Schottky Barrier Drain Contact, Int'l Symposium on Power Semiconductor Devices & Ics, Tokyo 1990, pp. 126–130.

Sin et al., The SINFET: A New High Conductance, High Switching Speed MOS–Gated Transistor, Electronic Letters, Nov. 1985, p. 1124.

Sin et al., Analysis and Characterization of the Hybrid Schottky Injection Field Effect Transistor, IEDM 86 –9.4, pp. 222–225.

*Primary Examiner*—Tuan H. Nguyen
*Attorney, Agent, or Firm*—George C. Chen

[57] ABSTRACT

A method of forming an alloyed drain field effect transistor (10). A field effect transistor and a bipolar transistor are formed in a portion of a monocrystalline semiconductor substrate (11) that is bounded by a first major surface (12). A control electrode (19) is isolated from the first major surface by a dielectric layer (18). A first current conducting electrode (23) contacts a portion of the first major surface (12). A second current conducting electrode (24) contacts another portion of the monocrystalline semiconductor substrate (11) and is capable of injecting minority carriers into the monocrystalline semiconductor substrate (11). In one embodiment, the second current conducting electrode contacts a second major surface (13) of the monocrystalline semiconductor substrate (11).

15 Claims, 2 Drawing Sheets

METHOD OF FORMING AN ALLOYED DRAIN FIELD EFFECT TRANSISTOR AND DEVICE FORMED

BACKGROUND OF THE INVENTION

The present invention relates, in general, to power semiconductor devices and methods of forming such devices. More particularly, the present invention relates to alloyed drain field effect transistors (ADFET's) and methods of forming such devices.

Power semiconductor devices are used in such applications as variable speed motor controllers, uninterruptible power supplies, and high frequency welders. Included in this category of semiconductor devices have been power metal oxide semiconductor field effect transistors (MOSFET's), insulated gate bipolar transistors (IGBT's) and Schottky Injection field effect transistors (SINFET's). All three types of devices offer similar gate drive capabilities, as well as a wide safe operating area (SOA). However, they differ most significantly in their conduction characteristics and switching speeds, IGBT's having the best conduction characteristics and power MOSFET's having the fastest switching speeds. The performance of a SINFET is close to that of a MOSFET being slightly slower while having slightly better conduction characteristics. Therefore the selection of a device for a specific application, requires a trade-off between switching speed and conduction characteristics. New devices, such as the ADFET, improve upon the switching speed performance of the IGBT while maintaining its conduction characteristics, thus reducing the trade-off costs associated with the prior art devices.

Typically, IGBT's include a substrate layer of a P conductivity type on which a relatively lightly doped epitaxial layer of an N conductivity type is formed, thereby forming a PN junction. Most of the IGBT device structure is fabricated in the epitaxial layer (more commonly referred to as the drift region), wherein the substrate layer serves as a bottom-side contact for the IGBT and forms an emitter region of a PNP transistor. The lightly doped epitaxial layer produces a drift region having a low conductivity, a high resistivity, and is capable of supporting high voltages. However, the high resistivity of the drift region increases the "on" resistance, which in turn limits the current rating of the IGBT. The PN junction formed between the substrate and the epitaxial layer lowers the "on" resistance by injecting minority carriers into the drift region. In addition, this injection of minority carriers increases the conductivity of the drift region.

The modulation of the "on" resistance and the conductivity of the drift region by injection of minority carriers across the PN junction implies that both majority and minority carriers participate significantly in current flow in the IGBT. Although the use of both carrier types is advantageous for "on" resistance and conductivity, during turn-off of the IGBT, the carriers produce a "tail" current which delays the turn-off of the device. One solution to reducing this "tail" is to insert a buffer zone between the substrate and the drift region, wherein the buffer zone is epitaxial silicon having the same conductivity type as the drift region but having a higher concentration of impurity material. However, this solution requires the formation of a second epitaxial layer, in addition to the first layer or drift region. A second solution is based upon the belief that the charge associated with the "tail" current may be reduced and the turn-off delay improved by, for example, providing recombination centers in the lattice structure of the epitaxial layer. These recombination centers may be formed by creating imperfections or damage in the epitaxial layer lattice structure using such means as irradiating the epitaxial layer. The SINFET provides still a third solution, control of the minority carrier injection into the drift region. Thus the formation of a Schottky barrier drain contact provides an efficient conduction path for electrons during turn off, thus improving the switching speed. A SINFET providing such improved performance is the subject of U.S. Pat. No. 5,397,716 issued to Samuel J. Anderson and assigned to the same assignee as the present invention.

However while SINFET's, for example the device in U.S. Pat. No. 5,397,716, offer a significant improvement in switching speed over IGBT's, the improvement is at the cost of conduction characteristics. Accordingly, it would be advantageous to form a device with performance that exceeds that of a SINFET. Such a device would have an "on" resistance close to that of an IGBT, as well as switching speeds close to that of a power MOSFET. It would be further advantageous that the method of forming this device exclude the formation of recombination centers and a buffer zone as these steps increase the cost and cycle time associated with manufacturing IGBT's.

DETAILED DESCRIPTION OF THE DRAWING

Figure 1:
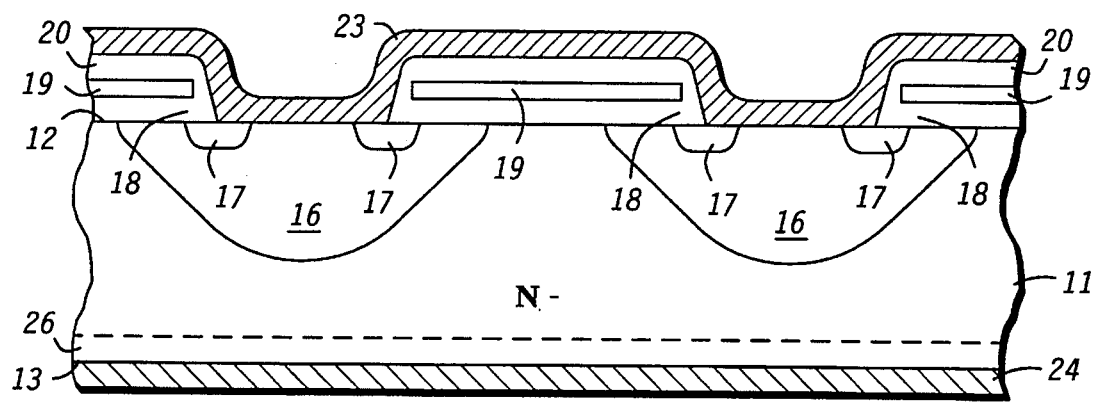
FIG. 1, illustrates a cross-sectional view of an embodiment of a vertical alloyed drain field effect device in accordance with the present invention.

FIG. 1 illustrates a highly simplified cross-sectional view of a portion of a vertical embodiment of an alloyed drain field effect device 10 in accordance with the present invention. More particularly, alloyed drain field effect transistor 10 is an improved insulated gate bipolar transistor that is referred to herein as an ADFET.

Semiconductor device 10 is fabricated in a monocrystalline semiconductor substrate 11, wherein semiconductor substrate 11 is comprised of a first or upper portion which is bounded by a first major surface 12 and a second or lower portion which is bounded by a second major surface 13. Semiconductor substrate 11 is commonly referred to as a drift region. Drift region 11 can have thickness ranging between approximately 100 micrometers and approximately 400 micrometers and preferably between approximately 200 micrometers and approximately 350 micrometers. In addition, drift region 11 is typically lightly doped with a dopant or impurity material of N-type conductivity. In one example, drift region 11 has an impurity material concentration in the range of approximately $1\times10^{13}$ to $5\times10^{14}$ atoms per cubic centimeter. Drift region 11 is a monocrystalline semiconductor material having a substantially uniform concentration of impurity material of N-type conductivity that may be formed using non-epitaxial growth techniques such as a Czochralski process or a float zone process as well as with epitaxial growth techniques. However, it is preferable to form drift region 11 using the Czochralski or float-zone monocrystalline silicon due to its lower costs.

In an embodiment of the present invention, the alloyed drain field effect transistor 10 is fabricated in the first portion of drift region 11 by forming at least one base well or region 16 of P-type conductivity. It will be understood that in an actual device 10 there can be a large number of base wells or P-type conductivity regions 16; however, the single figure illustrates only two for a basic understanding of the invention. Base wells 16, also referred to as base regions, are spaced apart laterally from one another and extend from first major surface 12 into drift region 11. Base wells 16 have a surface concentration of P-type impurity material between approximately $1.0 \times 10^{16}$ and $1.0 \times 10^{20}$ atoms per cubic centimeter, and form PN junctions with drift region 11. Base wells 16 may have, for example, a maximum width of approximately 40 micrometers and a maximum depth of approximately 8 micrometers. For a 1200 volt device, a maximum well width of approximately 30 micrometers and a well depth of approximately 4 micrometers have been employed.

A source region 17, also referred to as a source or N-type conductivity region, is formed in each base well 16. Source region 17 is shaped as a toroid, in a plan view (not shown), thus having a central opening. In the cross-sectional view shown in the single drawing, this toroid is seen as two source wells of N-type conductivity. A channel is formed in the base region between source regions 17 and drift region 11 which is adjacent first major surface 12. Source regions 17 extend from first major surface 12 into base wells 16 and have a surface concentration of N-type dopant of between approximately $1.0 \times 10^{17}$ and $1.0 \times 10^{21}$ atoms per cubic centimeter. Typically the doping concentration of source regions 17 must be greater than that of base wells 16. Source regions 17 of the cross-sectional view may have, for example, a width ranging between approximately 1.0 and approximately 10.0 micrometers and a maximum depth of approximately 1.5 micrometers. For example, for a 1200 volt device, a source width of approximately 3 micrometers and a source depth of approximately 1 micrometer have been employed.

A first layer of dielectric material 18, commonly referred to as a gate oxide, is formed on first major surface 12. Gate electrodes 19 are patterned over first dielectric layer 18 wherein each gate electrode 19 extends laterally from a portion of a source well 17 in one base well 16 to a portion of a proximal source well 17 in an adjacent base well 16. Thus, gate electrodes 19 extend over two adjacent channels. Gate electrodes 19 are formed from an electrically conductive material such as, polysilicon, aluminum, or the like. Gate electrodes 19 and exposed portions of first dielectric layer 18 are covered by a second layer of dielectric material 20.

A portion of first major surface 12 is exposed by forming windows in first and second dielectric layers 18 and 20, respectively. More particularly, the windows expose a portion of first major surface 12 over source 17 that is within a single base well 16. Further, the windows expose that portion of first major surface 12 illustrated as being between the source regions 17 in each base well 16. Subsequently, a source electrode or contact 23 is formed over the exposed first portion of first major surface 12 and over second dielectric layer 20. Thus, source electrode 23 forms an electrical contact which is over a portion of base wells or regions 16 and a portion of source regions 17. Preferably, source contact 23 is aluminum or an aluminum alloy as is well know in the art.

Techniques for the formation of base and source regions 16 and 17, respectively, dielectric layers 18 and 20, gate electrodes 19 and source electrode 23 include conventional semiconductor processing steps such as masking, ion implantation, diffusion, photolithography, etc. The use of conventional semiconductor processing steps are well known in the art and may be found in U.S. Pat. No. 5,178,370 which issued to Clark et al. on Jan. 12, 1993 and is entitled "Conductivity Modulated Insulated Gate Semiconductor Device", which is hereby incorporated herein by reference. Thus, a portion of an alloyed drain field effect transistor that corresponds to an insulated gate semiconductor device is formed in the upper portion of drift region 11, wherein the portion includes a field effect transistor and a bipolar transistor, a source electrode 23 and a gate electrode 19.

In accordance with the present invention, a minority carrier injecting, alloyed metal-semiconductor contact is formed with semiconductor substrate 11. In a preferred embodiment, the minority carrier injecting alloyed metal-semiconductor contact serves not only as an electrical contact, but also as a P-type dopant source for semiconductor substrate 11. For example, metal layer 24 can both P-type dope semiconductor substrate 11 and form the minority carrier injecting, alloyed metal-semiconductor contact, with second major surface 13, having both ohmic and Schottky characteristics. This is unlike a typical IGBT device where the semiconductor substrate would be P-type type doped, for example by implantation of boron, prior to metalization and only an ohmic contact is formed.

Typically aluminum will be the metal of choice for serving as both a P-type dopant and drain contact. Alternatively, any predominantly aluminum alloy well known in the art, such as 'aluminum/1% silicon', 'aluminum/2% copper', 'aluminum/2% copper/1% silicon' can be employed, as can any other material that can serve as both a P-type dopant and metal contact. Thus, referring to FIG. 1, layer 24 is comprised substantially of aluminum, having a thickness ranging from approximately 0.25 to 1 micrometer formed on major surface 13. Layer 24 can be formed by any of the standard evaporation or sputtering techniques well known to those skilled in the art.

In the method and device of the present invention, layer 24 must be alloyed into major surface 13 to both make electrical contact to surface 13 and to serve as a P-type dopant source to substrate 11 and form an essentially P-type region 26 adjacent layer 24. If no alloy step is performed, layer 24 cannot serve as a dopant to substrate 11, and the contact with surface 13 would have little, if any, ohmic character due to the relatively light doping of substrate 11. Thus, if no anneal is performed, layer 24 will not provide a suitable electrical contact.

In one embodiment, layer 24 is alloyed, utilizing a rapid thermal annealer (RTA). It has been found that heating the semiconductor substrate to a temperature range of approximately 300 to 500 degrees Centigrade, for a time of between approximately 10 and 200 seconds is required in an RTA to achieve both good contact and adequate doping. For example, layer 24 comprising a 0.4 micrometer aluminum film can be alloyed at a temperature of between approximately 420° to 460° C. for a time of between approximately 100 to 140 seconds. An inert, or reducing atmosphere, such as forming gas, is preferably employed to eliminate the possibility of oxidizing layer 24 during the heating and cooling portions of the alloying process.

In another embodiment, the alloy process is performed using a standard diffusion type furnace thus allowing the simultaneous processing of many wafers. The specific times and temperatures applicable to a furnace alloying process are readily determined by experimentation.

Figure 3:
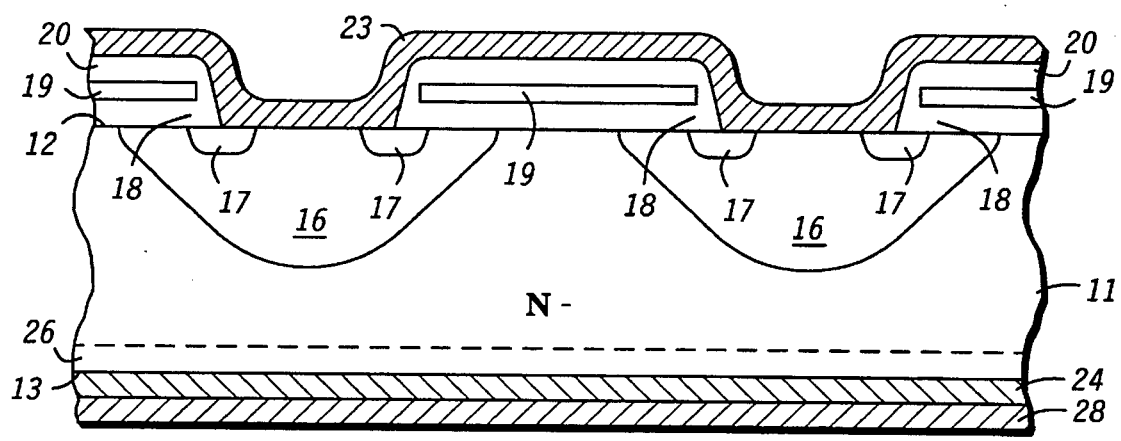
FIG. 3, illustrates a cross-sectional view of another embodiment of a vertical alloyed drain field effect device having a multi-metal layer in accordance with the present invention.

FIG. 3 illustrates a cross-sectional view of another embodiment in accordance with the present invention. Layer 24 is overlaid with multi-metal layer 28 comprised of layers of titanium, nickel and silver Typically, multi-metal layer 28 is formed prior to the alloy step to reduce wafer handling and reduce the possibility of aluminum oxidation, however multi-metal layer 28 can also be formed subsequent to such an alloy step. A multi-layer metal structure of multi-metal layer 28 overlying metal layer 24 can be employed as a final metallization to facilitate packaging and die attachment. Other combination metal structures may also be employed for multi-metal layer 28. The formation of these final metalization layers for example multi-metal layer 28, is well known in the art.

By now it should be appreciated that a method for forming an alloyed drain field effect device has been presented. Using the method of the present invention, an alloyed drain field effect transistor is fabricated in a semiconductor substrate, wherein a portion of the alloyed drain field effect device is formed in the first portion bounded by the first major surface. The portion of the alloyed drain field effect device comprises a field effect transistor and at least one bipolar transistor and has a control or gate electrode 19 and a first current conducting electrode 23.

It is believed that an alloyed metal-semiconductor contact capable of injecting minority carriers is formed, when a metal layer, capable of acting both as a P-type dopant for silicon and a contact, is alloyed with substrate 11. This alloyed metal-semiconductor contact which serves as an anode, or drain contact, of the ADFET will be comprised of at least one metal layer, typically aluminum. Thus the property of a layer 24, comprised substantially of aluminum, to both make electrical contact to the second major surface 13 of the semiconductor substrate and form a P-type region 26, adjacent surface 13, is utilized. This resultant minority carrier injecting, alloyed metal-semiconductor contact is unexpected. One skilled in the art would expect a metal, such as aluminum, to only form a Schottky type contact with lightly doped substrate 13. Thus device modeling of the above structure with only the expected aluminum Schottky contact, predicts performance substantially different than what has been obtained. The actual performance obtained is thus both unexpected, and significantly improved from values predicted for the expected Schottky type contact. Thus it appears that a "hybrid" electrical contact and "hybrid" P-type region 26 are formed to generate the unexpected results observed.

An advantage of the ADFET of the present invention over, for example an IGBT, is found in the forming of an alloyed metal-semiconductor electrode that serves as a minority carrier contact. Such an alloyed metal-semiconductor electrode, also referred to as the anode or drain contact of the present invention, gains that advantage in the simplified wafer processing required. First, drift region irradiation, typically performed at locations away from the semiconductor manufacturer's own processing facilities, may be eliminated along with its associated financial and time expenses. In addition, as drift region irradiation damages the gate oxide, and lowers the threshold voltage of the device, the elimination of drift region irradiation also results in better device performance.

Secondly, unlike a MOSFET, the present invention lends itself to the use of non-epitaxially grown silicon such as, for example, silicon formed using either a Czochralski process or a float-zone process, thereby allowing a substantial cost savings. The ADFET even maintains an advantage over IGBT's made with a backside boron (P-type) implant into a thin float-zone wafer, as the P-type dopant is supplied by layer 24, thus eliminating the need for a separate implant step.

Finally, the formation of an alloyed metal-semiconductor contact is much simplified over the formation of a Schottky contact as found in the typical SINFET device. For example, Schottky contact formation often requires complex pre-metallization cleaning steps to insure intimate metal to semiconductor contact. On the other hand, the formation of an alloyed contact does not normally require such complex pre-metallization cleans, as temperatures of the alloying process, in the range of 300° to 500° C., facilitate the dissolution of any native silicon oxide that might impede Schottky contact formation.

Referring now to Table 1, a comparison of the performance of the various devices is presented. The values for current characteristics and switching speed are an order of merit. The best device in each category is rated '10' the worst '1' and relative values are assigned to the other devices. As can be readily seen, the ADFET device of the present invention offers the best compromise of switching speed and current characteristics.

TABLE 1

|  | Current Characteristics | Switching Speed |
| --- | --- | --- |
| MOSFET | 1 | 10 |
| SINFET | 3 | 8 |
| ADFET | 7 | 7 |
| IGBT | 10 | 1 |

Figure 2:
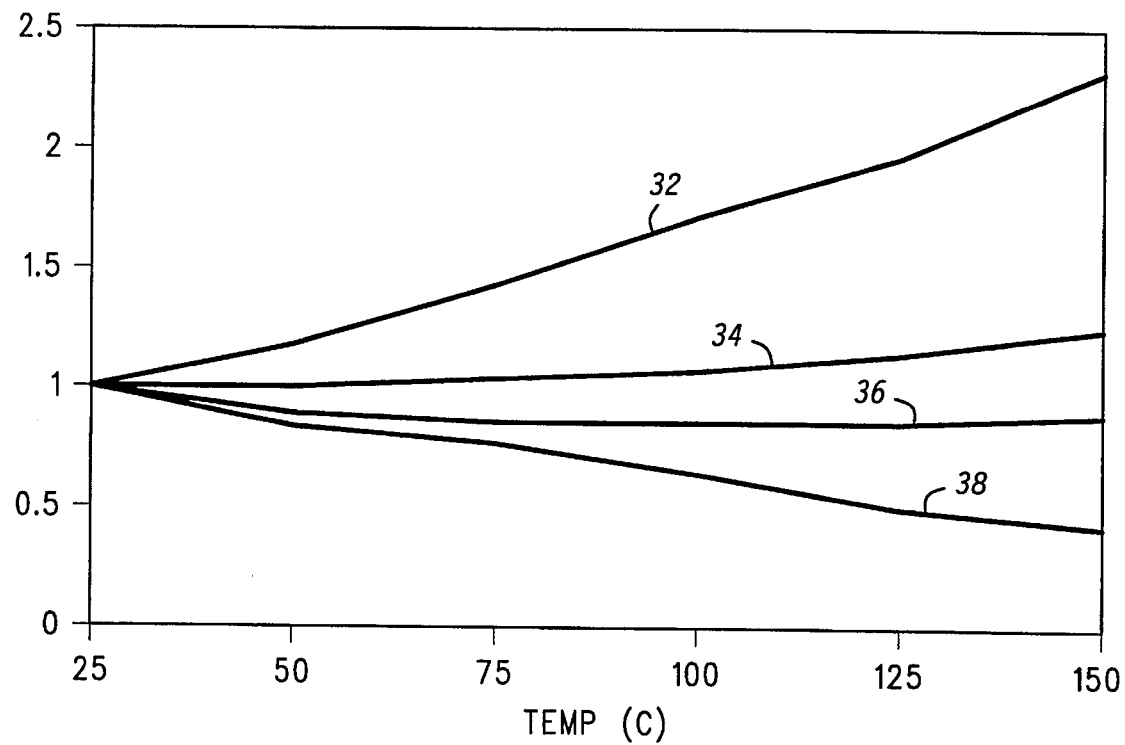
FIG. 2, is a graphical comparison of experimental ADFET, MOSFET and IGBT on-voltage temperature coefficients to modeled data for a SINFET.

In addition, referring now to FIG. 2, the enhanced performance of the ADFET 36, with respect to On-Voltage vs. Temperature is readily seen. Actual data collected for the power MOSFET 32, IGBT 34 and ADFET 36 are presented with modeled data for a SINFET 38.

By now it should be appreciated from the description and figures provided that an improved power semiconductor device has been provided. The ADFET device described provides for a power semiconductor device with the best trade-off of switching speed and current characteristics available.

We claim:

1. A method of forming an alloyed drain field effect transistor, comprising the steps of:

providing a semiconductor substrate, the semiconductor substrate having a first major surface, a second major surface, and being of N-type conductivity and a first concentration;

forming at least one region of a P-type conductivity, the at least one region of the P-type conductivity extending into the semiconductor substrate;

forming at least one N-type conductivity region in the at least one region of the P-type conductivity, the at least one N-type conductivity region extending into the at least one region of the P-type conductivity;

forming a first layer of dielectric material overlying the first major surface;

patterning the first layer of dielectric material to expose portions of the at least one N-type conductivity region and the at least one region of P-type conductivity;

forming an electrically conductive material overlying the first major surface, wherein the electrically conductive material is patterned and electrically coupled to the exposed portions of the at least one region of the P-type conductivity and the at least one N-type conductivity region; and forming a P-type region by alloying an metal-semiconductor contact with said semiconductor substrate, wherein the alloyed metal-semiconductor contact is comprised of a metal that dopes the semiconductor substrate to form a P-type region.

2. A method of forming an alloyed drain field effect transistor as claimed in claim 1, wherein the step of forming a P-type region includes forming a metal layer on the second major surface.

3. A method of forming an alloyed drain field effect transistor as claimed in claim 2, wherein the step of forming a P-type region includes forming a metal layer, comprised substantially of aluminum, on the semiconductor substrate.

4. A method of forming an alloyed drain field effect transistor as claimed in claim 2 wherein, the step of forming a P-type region includes forming a multi-layer metal structure, wherein the multi-layer metal structure is comprised of a first layer, comprised substantially of aluminum, a second layer comprising titanium, a third layer comprising nickel, and a fourth layer comprising silver.

5. A method of forming an alloyed drain field effect transistor as claimed in claim 1, wherein the step of forming a P-type region further comprises heating the semiconductor substrate to between approximately 300 to 500 degrees centigrade in an inert or reducing atmosphere.

6. A method of forming an alloyed drain field effect transistor as claimed in claim 5, wherein the step of heating the semiconductor substrate is performed utilizing a furnace or a rapid thermal annealer.

7. A method of forming an alloyed drain field effect transistor as claimed in claim 5, wherein the step of heating the semiconductor substrate is performed after forming a multi-layer metal structure comprising a first layer, comprised substantially of aluminum, a second layer comprised of titanium, a third layer comprised of nickel, and a fourth layer comprised of silver.

8. A method of forming an alloyed drain field effect transistor as claimed in claim 7, further comprising the steps of:

forming a second layer of dielectric material overlying at least a portion of the first layer of dielectric material and overlying at least a portion of the electrically conductive material;

forming windows in the first layer of dielectric material and the second layer of dielectric material to expose at least one region of P-type conductivity and at least one region of N-type conductivity; and forming a second layer of electrically conductive material on the second layer of dielectric material and exposed regions of P-type and N-type conductivity, wherein the second layer of electrically conductive material is patterned and electrically contacts the at least one region of P-type conductivity and the at least one region of N-type conductivity.

9. A method of forming an alloyed drain field effect transistor as claimed in claim 1, wherein the step of forming a P-type region includes forming the alloyed metal-semiconductor contact on the second major surface.

10. A method of forming an alloyed drain field effect device, comprising the steps of:

providing an N-type semiconductor substrate, the N-type semiconductor substrate having a first major surface, a second major surface and a first concentration;

forming at least one base region of a P-type conductivity, the at least one base region extending from the first major surface into the N-type semiconductor substrate;

forming at least one source region of an N-type conductivity in the at least one base region, the at least one source region extending from the first major surface into the at least one base region;

forming a first layer of dielectric material overlying the first major surface and leaving portions of the at least one base region and the least one source region exposed;

forming an electrically conductive material on the first layer of dielectric material, the exposed portions of the at least one source region and the at least one base region, wherein the electrically conductive material is patterned and electrically coupled to the at least one base region and the at the at least one source region;

forming a metal layer overlying the second major surface; and heating the N-type semiconductor substrate, wherein the metal layer is alloyed with the N-type semiconductor substrate, and wherein the metal layer dopes the N-type semiconductor substrate to from a P-type region adjacent the second major surface.

11. A method of forming an alloyed drain field effect device as claimed in claim 10, wherein the step of forming a metal layer comprises forming a metal layer comprised substantially of aluminum.

12. A method of forming an alloyed drain field effect device as claimed in claim 10, wherein the step of heating the N-type semiconductor substrate comprises heating to between approximately 300 to 500 degrees centigrade in an inert or reducing atmosphere.

13. A method of forming an alloyed drain field effect device as claimed in claim 12, wherein the step of heating the N-type semiconductor substrate is performed utilizing a furnace or a rapid thermal annealer.

14. A method of forming an alloyed drain field effect device as claimed in claim 10 wherein, the step of forming a metal layer includes forming a multi-layer metal structure, wherein a first layer comprising aluminum, a second layer comprising titanium, a third layer comprising nickel, and a fourth layer comprising silver are formed.

15. A method of forming an alloyed drain field effect device as claimed in claim 10, further comprising the steps of:

forming a second layer of dielectric material overlying the first layer of dielectric material and the electrically conductive material;

forming windows in the first and second layer of dielectric material to expose a portion of the first major surface over the at least one source region within the at least one base region and a portion of the first major surface within the at least one base region between adjacent source regions; and forming a second layer of electrically conductive material on the second layer of dielectric and exposed portions of the first major surface, wherein the second layer of electrically conductive material is patterned and electrically contacts the portion of the first major surface exposed.

* * * * *